US011195956B2

(12) United States Patent
Baeck et al.

(10) Patent No.: US 11,195,956 B2
(45) Date of Patent: Dec. 7, 2021

(54) THIN-FILM TRANSISTOR, DISPLAY DEVICE INCLUDING THE SAME, AND METHOD OF MANUFACTURING THE SAME

(71) Applicant: LG Display Co., Ltd., Seoul (KR)

(72) Inventors: JuHeyuck Baeck, Paju-si (KR); Dohyung Lee, Paju-si (KR); ChanYong Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/502,312

(22) Filed: Jul. 3, 2019

(65) Prior Publication Data
US 2020/0176603 A1    Jun. 4, 2020

(30) Foreign Application Priority Data
Dec. 4, 2018    (KR) .......................... 10-2018-0154143

(51) Int. Cl.
*H01L 29/786* (2006.01)
*H01L 29/66* (2006.01)
*H01L 27/32* (2006.01)
*H01L 27/12* (2006.01)

(52) U.S. Cl.
CPC ...... *H01L 29/7869* (2013.01); *H01L 27/1262* (2013.01); *H01L 27/1296* (2013.01); *H01L 27/3262* (2013.01); *H01L 27/3272* (2013.01); *H01L 29/6675* (2013.01); *H01L 29/78663* (2013.01)

(58) Field of Classification Search
CPC ......................... H01L 29/78681–78696; H01L 29/78651–78678; H01L 29/7869; H01L 29/78663; H01L 29/6675; H01L 27/3262; H01L 27/1262; H01L 27/3272; H01L 27/1296; H01L 27/1225; H01L 29/78633; H01L 29/78696; H01L 29/66969
See application file for complete search history.

(56) References Cited

U.S. PATENT DOCUMENTS

| 8,729,613 | B2  | 5/2014  | Honda et al. |
| 8,742,413 | B2  | 6/2014  | Oh et al. |
| 9,829,533 | B2* | 11/2017 | Tsubuku ............. H01L 29/7869 |
| 10,008,614 | B1 | 6/2018  | He et al. |
| 2011/0127520 | A1 | 6/2011 | You |
| 2012/0319102 | A1* | 12/2012 | Yamazaki ........... H01L 29/7869 257/43 |

(Continued)

FOREIGN PATENT DOCUMENTS

| JP | 2011-029373 A | 2/2011 |
| KR | 10-2012-0079724 A | 7/2012 |
| KR | 10-2014-0074384 A | 6/2014 |

Primary Examiner — Jonathan Han
(74) Attorney, Agent, or Firm — Morgan, Lewis & Bockius LLP

(57) ABSTRACT

A thin-film transistor, a display device including a thin-film transistor, and a method of manufacturing a thin-film transistor are provided. A thin-film transistor includes: a semiconductor layer including: a first oxide semiconductor layer including gallium (Ga), a second oxide semiconductor layer, and a silicon semiconductor layer between the first oxide semiconductor layer and the second oxide semiconductor layer, and a gate electrode spaced apart from the semiconductor layer and partially overlapping at least a part of the semiconductor layer.

21 Claims, 12 Drawing Sheets

(56) References Cited

U.S. PATENT DOCUMENTS

| | | | |
|---|---|---|---|
| 2013/0221360 A1* | 8/2013 | Tsang | H01L 29/78696 257/66 |
| 2014/0106502 A1* | 4/2014 | Tezuka | H01L 21/823857 438/104 |
| 2016/0049517 A1* | 2/2016 | Lee | H01L 29/7869 257/43 |
| 2017/0092661 A1 | 3/2017 | Zhu | |
| 2017/0229584 A1 | 8/2017 | Okada | |
| 2017/0278873 A1 | 9/2017 | Yang et al. | |
| 2018/0061922 A1 | 3/2018 | Kim et al. | |
| 2018/0323311 A1 | 11/2018 | Zhai | |

\* cited by examiner

THIN-FILM TRANSISTOR, DISPLAY DEVICE INCLUDING THE SAME, AND METHOD OF MANUFACTURING THE SAME

CROSS-REFERENCE TO RELATED APPLICATION(S)

This application claims the benefit of and priority to Korean Patent Application No. 10-2018-0154143, filed on Dec. 4, 2018, the entirety of which is hereby incorporated by reference.

BACKGROUND

1. Technical Field

The present disclosure relates to a thin-film transistor, a display device including the same, and a method of manufacturing the same. More particularly, the present disclosure relates to a thin-film transistor including a silicon semiconductor layer disposed between each of oxide semiconductor layers, a display device including the same, and a method of manufacturing the same.

2. Discussion of the Related Art

A thin-film transistor may be manufactured on a glass substrate or a plastic substrate, and the thin-film transistor is widely used as a switching device or a driving device in a display device, such as a liquid crystal display device or an organic light-emitting device. According to a material used for an active layer, the thin-film transistor may be categorized into an amorphous silicon thin-film transistor having an active layer of amorphous silicon, a polycrystalline silicon thin-film transistor having an active layer of polycrystalline silicon, and an oxide semiconductor thin-film transistor having an active layer of oxide semiconductor.

The amorphous silicon is deposited in a short time, and is formed as an active layer, whereby the amorphous silicon thin-film transistor (a-Si TFT) has advantages of short manufacturing time and low manufacturing cost. Meanwhile, it has disadvantages of inferior current driving efficiency due to low mobility, and a change of a threshold voltage. Thus, it is difficult to use the amorphous silicon thin-film transistor for an active matrix organic light-emitting device (AMOLED).

The polycrystalline silicon thin-film transistor (poly-Si TFT) may be obtained by depositing amorphous silicon and crystallizing the deposited amorphous silicon. The polycrystalline silicon thin-film transistor has advantages of high electron mobility and great stability, realization of a thin profile and high resolution, and high power efficiency. The polycrystalline silicon thin-film transistor may include a low-temperature polysilicon (LTPS) thin-film transistor, and a polysilicon thin-film transistor. However, a process of manufacturing the polycrystalline silicon thin-film transistor inevitably needs a step of crystallizing the amorphous silicon, whereby a manufacturing cost is increased due to the increased number of manufacturing steps. Also, the polycrystalline silicon thin-film transistor has a disadvantage of crystallization at a high temperature. Thus, it is difficult to apply the polycrystalline silicon thin-film transistor to a large-sized display device.

The oxide semiconductor thin-film transistor ("oxide semiconductor TFT"), which has high mobility and has a large resistance change in accordance with an oxygen content, is advantageous in that it facilitates obtaining desired properties. Also, an active layer of oxide is formed at a relatively low temperature for a process of manufacturing the oxide semiconductor thin-film transistor, whereby it is possible to lower a manufacturing cost. Also, owing to the properties of oxide, an oxide semiconductor is transparent, whereby it is favorable to realization of a transparent display device. However, in comparison to the polycrystalline silicon thin-film transistor, the oxide semiconductor thin-film transistor has relatively low stability and electron mobility.

Recently, with an advancement of high resolution or high pixel density in a mobile display device, lots of pixels are arranged in a small area, whereby a thin-film transistor for switching or driving the pixel inevitably needs good electrical properties and high stability. Thus, it is desirable to provide a thin-film transistor having good electrical properties and high stability.

SUMMARY

Accordingly, the present disclosure is directed to a thin-film transistor, a display device including the same, and a method of manufacturing the same that substantially obviate one or more of the issues due to limitations and disadvantages of the related art.

An aspect of the present disclosure is to provide a thin-film transistor having good electrical stability, a display device comprising the same, and a method of manufacturing the same.

Another aspect of the present disclosure is to provide a thin-film transistor having improved electrical stability by the use of a silicon semiconductor layer disposed between two oxide semiconductor layers, a display device comprising the same, and a method of manufacturing the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a thin-film transistor, including: a semiconductor layer including: a first oxide semiconductor layer including gallium (Ga), a second oxide semiconductor layer, and a silicon semiconductor layer between the first oxide semiconductor layer and the second oxide semiconductor layer, and a gate electrode spaced apart from the semiconductor layer and partially overlapping at least a part of the semiconductor layer.

In another aspect, there is provided a display device, including: a substrate, a pixel driving circuit on the substrate, and a display element connected to the pixel driving circuit, the pixel driving circuit including a thin-film transistor, the thin-film transistor including: a semiconductor layer including: a first oxide semiconductor layer including gallium (Ga), a second oxide semiconductor layer, and a silicon semiconductor layer between the first oxide semiconductor layer and the second oxide semiconductor layer, and a gate electrode spaced apart from the semiconductor layer and partially overlapping at least a part of the semiconductor layer.

In another aspect, there is provided a method of manufacturing a thin-film transistor, the method including: providing a semiconductor layer including: providing a first oxide semiconductor layer including gallium (Ga), providing a second oxide semiconductor layer, and forming a silicon semiconductor layer by metal-organic chemical vapor deposition (MOCVD) between the first oxide semiconductor layer and the second oxide semiconductor layer, and providing a gate electrode spaced apart from the semiconductor layer and partially overlapping at least a part of the semiconductor layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
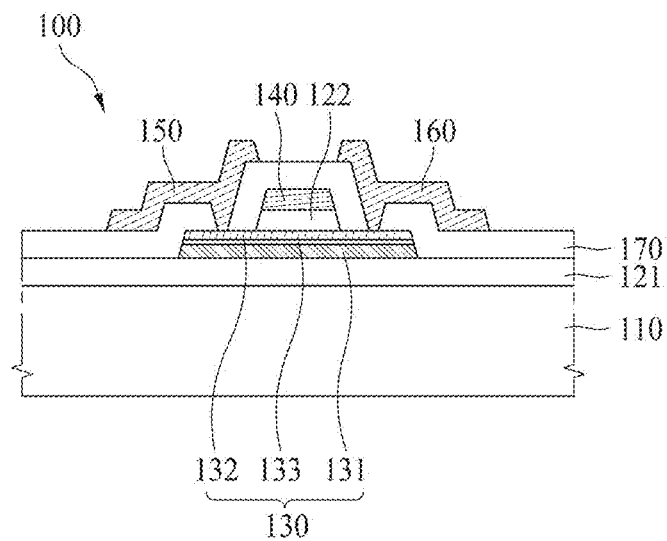
FIG. 1 is a cross-sectional view illustrating a thin-film transistor according to one embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

FIG. 1 is a cross-sectional view illustrating a thin-film transistor according to one embodiment of the present disclosure.

A thin-film transistor 100 according to one embodiment of the present disclosure may include a semiconductor layer 130, and a gate electrode 140 spaced apart from the semiconductor layer 130 and partially overlapping the semiconductor layer 130. With reference to the example of FIG. 1, the semiconductor layer 130 may be on a substrate 110.

The substrate 110 may include glass or plastic. For example, the substrate 110 may include a transparent plastic material having flexibility, for example, polyimide.

A buffer layer 121 may be on the substrate 110. The buffer layer 121 may include at least one of silicon oxide and silicon nitride. The buffer layer 121 may be formed in a single-layered structure, or in a multi-layered structure having at least two layers. The buffer layer 121 may have good insulating properties and good planarization properties, and the buffer layer 121 may protect the semiconductor layer 130. The buffer layer 121 may be omitted.

According to one embodiment of the present disclosure, the semiconductor layer 130 may include a first oxide semiconductor layer 131, a second oxide semiconductor layer 132, and a silicon semiconductor layer 133 between the first oxide semiconductor layer 131 and the second oxide semiconductor layer 132. The silicon semiconductor layer 133 may contact each of the first oxide semiconductor layer 131 and the second oxide semiconductor layer 132. The first oxide semiconductor layer 131 and the second oxide semiconductor layer 132 may be spaced apart from each other by the silicon semiconductor layer 133. With reference to FIG. 1, the first oxide semiconductor layer 131 may contact one surface of the silicon semiconductor layer 133. The second oxide semiconductor layer 132 may contact the other surface of the silicon semiconductor layer 133. For example, the silicon semiconductor layer 133 may contact at least one of the first oxide semiconductor layer 131 and the second oxide semiconductor layer 132.

With reference to FIG. 1, the first oxide semiconductor layer 131, the silicon semiconductor layer 133, and the second oxide semiconductor layer 132 may be sequentially disposed on the substrate 110. However, embodiments of the present disclosure are not limited to the above structure. For example, the first oxide semiconductor layer 131 and the second oxide semiconductor layer 132 may be positioned interchangeably.

According to one embodiment of the present disclosure, the first oxide semiconductor layer 131 may serve as a supporting layer for supporting the second oxide semiconductor layer 132, and the second oxide semiconductor layer 132 may serve as a channel layer. A channel of the semiconductor layer 130 may be formed in the second oxide semiconductor layer 132.

The first oxide semiconductor layer 131 serving as the supporting layer may have great film stability and good mechanical properties. For the great film stability, the first oxide semiconductor layer 131 may include gallium (Ga). Herein, gallium (Ga) may form a stabilized bonding to oxygen, and gallium oxide has good film stability. Thus, if the oxide semiconductor layer includes gallium (Ga), it is possible to improve film stability and etch resistance. According to one embodiment of the present disclosure, the first oxide semiconductor layer 131 may include one or more of: an IGZO (indium gallium zinc oxide; InGaZnO)-based oxide semiconductor material, an IGO (indium gallium oxide; InGaO)-based oxide semiconductor material, an IGTO (indium gallium tin oxide; InGaSnO)-based oxide semiconductor material, an IGZTO (indium gallium zinc tin oxide; InGaZnSnO)-based oxide semiconductor material, a GZTO (gallium zinc tin oxide; GaZnSnO)-based oxide semiconductor material, a GZO (gallium zinc oxide; GaZnO)-based oxide semiconductor material, and a GO (gallium oxide; GaO)-based oxide semiconductor material. Embodiments are not limited to these examples.

For the good film stability, the first oxide semiconductor layer 131 may include gallium (Ga) of 40 atom % or more in comparison to a total metallic element with respect to an atom number. When gallium (Ga) of 40 atom % or more is included in the total metallic element of the first oxide semiconductor layer 131, the first oxide semiconductor layer 131 may have the good film stability.

According to one embodiment of the present disclosure, the metallic element of the first oxide semiconductor layer 131 may be all gallium (Ga). In this case, the first oxide semiconductor layer 131 may include the GO (GaO)-based oxide semiconductor material, and the content of gallium (Ga) in the entire metallic element of the first oxide semiconductor 131 may be 100 atom %. In consideration of the electrical properties of the first oxide semiconductor layer 131, the first oxide semiconductor layer 131 may include gallium (Ga) of 90 atom % or less in comparison to the total metallic element.

According to one embodiment of the present disclosure, the first oxide semiconductor layer 131 may have a thickness of 10 nm to 50 nm. If the thickness of the first oxide semiconductor layer 131 is less than 10 nm, the film stability of the first oxide semiconductor layer 131 may be deteriorated. Meanwhile, if the thickness of the first oxide semiconductor layer 131 is more than 50 nm, the semiconductor layer 130 may have an increased total thickness so that it may be difficult to realize a thin profile of a display device.

According to one embodiment of the present disclosure, a channel of the thin-film transistor 100 may be formed in the second oxide semiconductor layer 132. Thus, the second oxide semiconductor layer 132 may be referred to as a "channel" layer. The second oxide semiconductor layer 132 may include an oxide semiconductor material. For example, the second oxide semiconductor layer 132 may include an IZO (indium zinc oxide; InZnO)-based oxide semiconductor material, an IGO (InGaO)-based oxide semiconductor material, an ITO (indium tin oxide; InSnO)-based oxide semiconductor material, an IGZO (InGaZnO)-based oxide semiconductor material, an IGZTO (InGaZnSnO)-based oxide semiconductor material, a GZTO (GaZnSnO)-based oxide semiconductor material, or an ITZO (indium tin zinc oxide; InSnZnO)-based oxide semiconductor material. However, embodiments of the present disclosure are not limited to the above. For example, the second oxide semiconductor layer 132 may include other oxide semiconductor materials generally known to those in the art.

According to one embodiment of the present disclosure, a concentration of gallium (Ga) in the first oxide semiconductor layer 131 may be higher than a concentration of gallium (Ga) in the second oxide semiconductor layer 132. Thus, the first oxide semiconductor layer 131 may have greater film stability in comparison to that of the second oxide semiconductor layer 132.

Indium (In) may improve a carrier concentration and current properties in the oxide semiconductor layer. According to one embodiment of the present disclosure, a concentration of indium (In) in the second oxide semiconductor layer 132 may be higher than a concentration of indium (In) in the first oxide semiconductor layer 131. Thus, the second oxide semiconductor layer 132 may have greater electrical properties in comparison to that of the first oxide semiconductor layer 131. According to one embodiment of the present disclosure, to provide the second oxide semiconductor layer 132 functioning as the channel layer, a carrier concentration of the second oxide semiconductor layer 132 may be higher than a carrier concentration of the first oxide semiconductor layer 131.

However, if the thickness of the second oxide semiconductor layer 132 having the high carrier concentration is increased too much, a variable range of a threshold voltage in the thin-film transistor 100 may be increased due to the high carrier concentration of the second oxide semiconductor layer 132, to thereby deteriorate the switching properties. Thus, according to one embodiment of the present disclosure, the second oxide semiconductor layer 132 may have a thickness of 50 nm or less.

Meanwhile, if the thickness of the second oxide semiconductor layer 132 is excessively small, the film stability of the second oxide semiconductor layer 132 is lowered so that it is difficult to provide a uniform film. Thus, the second oxide semiconductor layer 132 may have a thickness of 5 nm or more.

According to one embodiment of the present disclosure, the second oxide semiconductor layer 132 may have a thickness of 5 nm to 50 nm. For example, the second oxide semiconductor layer 132 may have a thickness of 10 nm to 30 nm.

According to one embodiment of the present disclosure, the first oxide semiconductor layer 131 and the second oxide semiconductor layer 132 may be formed by metal-organic chemical vapor deposition (MOCVD). If the first oxide semiconductor layer 131 and the second oxide semiconductor layer 132 are formed by MOCVD, each of the first oxide semiconductor layer 131 and the second oxide semiconductor layer 132 may be a stable thin film having a uniform surface. Thus, it may be possible to form the first oxide semiconductor layer 131 and the second oxide semiconductor layer 132 having uniformity, stability, and fine film structure by the MOCVD.

Generally, gallium (Ga) may be excited by light, and then the excited gallium may emit an excited electron. Also, gallium (Ga) may trap a hole so that it may be possible to prevent an electron from being restricted by the hole.

When the first oxide semiconductor layer 131 is irradiated with light, gallium (Ga) included in the first oxide semiconductor layer 131 may absorb light, to thereby emit the electron. If the first oxide semiconductor layer 131 is in direct contact with the second oxide semiconductor layer 132, the electron generated from gallium (Ga) of the first oxide semiconductor layer 131 by the light absorption may be transferred to the second oxide semiconductor layer 132, whereby the carrier concentration of the second oxide semiconductor layer 132 may be increased. When the carrier (e.g., electron) concentration of the second oxide semiconductor layer 132 is increased, a threshold voltage may be lowered, whereby the threshold voltage of the thin-film transistor 100 may be shifted to a negative (−) direction. As a result, the driving properties of the thin-film transistor 100 may become unstable. To reduce or prevent the driving properties of the thin-film transistor 100 from being unstable, according to one embodiment of the present disclosure, the silicon semiconductor layer 133 may be disposed between the first oxide semiconductor layer 131 and the second oxide semiconductor layer 132.

According to one embodiment of the present disclosure, the silicon semiconductor layer 133 may be an intrinsic silicon semiconductor layer. The term "intrinsic silicon semiconductor" indicates a pure semiconductor without any impurities.

For example, the silicon semiconductor layer 133 according to one embodiment of the present disclosure may include the intrinsic silicon semiconductor. The silicon semiconductor layer 133 may include silicon in which impurities are not included, or in which impurities are scarcely included (e.g., very few impurities are included).

Also, according to one embodiment of the present disclosure, the silicon semiconductor layer 133 may include amorphous silicon. For example, when a silicon layer is formed by a deposition method, and an additional heat treatment is not carried out, the silicon semiconductor layer 133 of the amorphous silicon may be formed. However, embodiments of the present disclosure are not limited to the above. For example the silicon semiconductor layer 133 may include polycrystalline silicon (poly-Si).

The silicon semiconductor layer 133 may function as a light-shielding layer or an electron-interrupting layer. The silicon has low light transmittance so that it may be possible to block light. Accordingly, it may be possible to reduce or prevent light from being transmitted through the first oxide semiconductor layer 131 or the second oxide semiconductor layer 132. For example, when light is incident from an upper side of the drawing in which the second oxide semiconductor layer 132 is positioned, the silicon semiconductor layer 133 may block light so that it may be possible to restrict or prevent the first oxide semiconductor layer 131 from being irradiated with light.

Also, a slight amount of current may flow through the silicon semiconductor layer 133 of the intrinsic semiconductor or a current may scarcely flow through the silicon semiconductor layer 133 of the intrinsic semiconductor, whereby the silicon semiconductor layer 133 may block or reduce a current flow. For example, when light is incident from a lower side of the FIG. 1 drawing in which the substrate 110 is positioned, light may approach the first oxide semiconductor layer 131, whereby the electron may be generated in the first oxide semiconductor layer 131. However, the silicon semiconductor layer 133 may serve as the electron interrupting layer so that it may be possible to restrict or prevent the electron generated in the first oxide semiconductor layer 131 from being transferred to the second oxide semiconductor layer 132. As a result, it may be possible to avoid or prevent the carrier concentration of the second oxide semiconductor layer 132 from being increased, and to constantly maintain the electrical properties in the second oxide semiconductor layer 132.

The silicon semiconductor layer 133 may have the properties of blocking the light, and of interrupting the electron transfer. For example, the silicon semiconductor layer 133 may maintain the properties of semiconductor. As a result, a laminated structure, including the first oxide semiconductor layer 131, the silicon semiconductor layer 133, and the second oxide semiconductor layer 132, may serve as the semiconductor layer 130 having the properties of semiconductor.

According to one embodiment of the present disclosure, the silicon semiconductor layer 133 may have a thickness of 2 nm to 20 nm. If the thickness of the silicon semiconductor layer 133 is less than 2 nm, the film stability and the light blocking properties of the silicon semiconductor layer 133 may be deteriorated. For example, if the thickness of the silicon semiconductor layer 133 is more than 20 nm, etching of the semiconductor layer 130 may become more difficult, and a processing cost may increase. In addition, if the thickness of the silicon semiconductor layer 133 is more than 20 nm, a carrier may be generated by a radiation of light, which may deteriorate the properties of the blocking current or the electron transfer.

According to one embodiment of the present disclosure, the silicon semiconductor layer 133 may be formed by metal-organic chemical vapor deposition (MOCVD). The silicon semiconductor layer 133 having a uniform surface, a thin profile, and a film stability may be formed by metal-organic chemical vapor deposition (MOCVD).

Also, if all of the first oxide semiconductor layer 131, the second oxide semiconductor layer 132, and the silicon semiconductor layer 133 are formed by metal-organic chemical vapor deposition (MOCVD), the first oxide semiconductor layer 131, the silicon semiconductor layer 133, and the second oxide semiconductor layer 132 may be sequentially formed without vacuum braking. As a result, it may be possible to decrease a manufacturing cost and to improve a process stability.

A gate insulating layer 122 may be on the semiconductor layer 130. The gate insulating layer 122 may include at least one of: silicon oxide and silicon nitride. The gate insulating layer 122 may include oxide aluminum ($Al_2O_3$). The gate insulating layer 122 may be formed in a single-layered structure or a multi-layered structure.

With further reference to FIG. 1, the gate electrode 140 may be on the gate insulating layer 122. The gate electrode 140 may be insulated from the semiconductor layer 130, and may partially overlap the semiconductor layer 130.

The gate electrode 140 may include one or more of: an aluminum-based metal, such as aluminum (Al) or an aluminum alloy; a silver-based metal such as silver (Ag) or a silver alloy; a copper-based metal, such as copper (Cu) or a copper alloy; a molybdenum-based metal, such as molybdenum (Mo) or a molybdenum alloy; chromium (Cr); tantalum (Ta), neodymium (Nd); and titanium (Ti). The gate electrode 140 may have a multi-layered structure, including at least two layers with different physical properties.

An insulating interlayer 170 may be on the gate electrode 140. The insulating interlayer 170 may include an insulating material. For example, the insulating interlayer 170 may include an organic material, an inorganic material, or a deposition structure including an organic material and an inorganic material.

The thin-film transistor 100 according to one embodiment of the present disclosure may include a source electrode 150 and a drain electrode 160. With further reference to FIG. 1, the source electrode 150 and the drain electrode 160 may be on the insulating interlayer 170. The source electrode 150 and the drain electrode 160 may be spaced apart from each other, and may be connected to the semiconductor layer 130. With additional reference to FIG. 1, the source electrode 150 and the drain electrode 160 may be respectively connected to the semiconductor layer 130 through contact holes provided in the insulating interlayer 170. For example, each of the source electrode 150 and the drain electrode 160 may be connected to the second oxide semiconductor layer 132 of the semiconductor layer 130.

The source electrode 150 and the drain electrode 160 may include one or more of: molybdenum (Mo), aluminum (Al), chromium (Cr), gold (Au), titanium (Ti), nickel (Ni), neodymium (Nd), copper (Cu), and their alloys. Each of the source electrode 150 and the drain electrode 160 may be formed in a single-layered structure, including the above metal or its alloy, or may be formed in a multi-layered structure, including at least two layers of the above metal or its alloy.

The semiconductor layer 130, the gate electrode 140, the source electrode 150, and the drain electrode 160, which are shown in FIG. 1, constitute the thin-film transistor 100. However, embodiments of the present disclosure are not limited to the above. Herein, other parts of the semiconductor layer 130, except a channel region overlapping the gate electrode 140, may become conductive, and then the conductive portions may become a source region and a drain region that may be spaced apart from each other with respect to the channel region therebetween. Thus, the source region and the drain region may serve as the source electrode 150 and the drain electrode 160, respectively.

Figure 2:
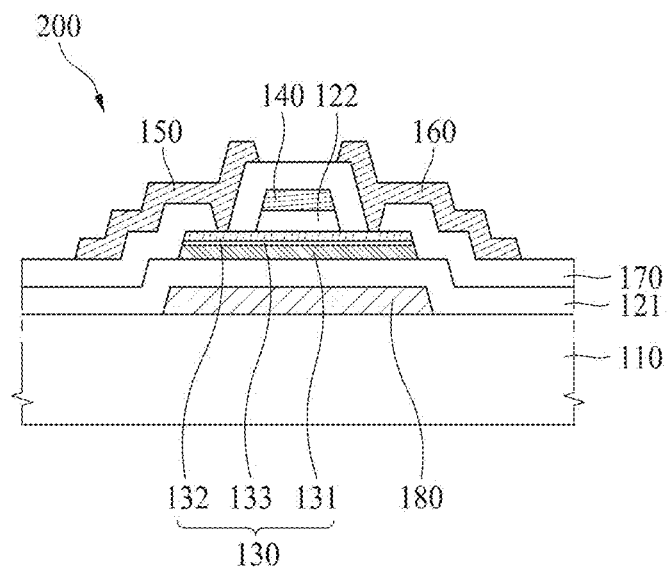
FIG. 2 is a cross-sectional view illustrating a thin-film transistor according to another embodiment of the present disclosure.

FIG. 2 is a cross-sectional view illustrating a thin-film transistor according to another embodiment of the present disclosure.

Hereinafter, to avoid a repetitive explanation, a detailed description for the same parts will be omitted. In comparison with the thin-film transistor 100 shown in the example of FIG. 1, a thin-film transistor 200 shown in the example of FIG. 2 may further include a light-shielding layer 180 between a substrate 110 and a buffer layer 121. The light-shielding layer 180 may overlap a semiconductor layer 130. The light-shielding layer 180 may block light incident on the semiconductor layer 130 of the thin-film transistor 200 from the external environment, to thereby reduce or prevent the semiconductor layer 130 from being damaged by the externally-provided light.

Generally, the light-shielding layer 180 may include an electrically conductive material, such as metal. The buffer layer 121 may be on the light-shielding layer 180 to insulate the light-shielding layer 180 and the semiconductor layer 130 from each other. The light-shielding layer 180 may be electrically connected to any one of a source electrode 150 and a drain electrode 160.

Figure 3:
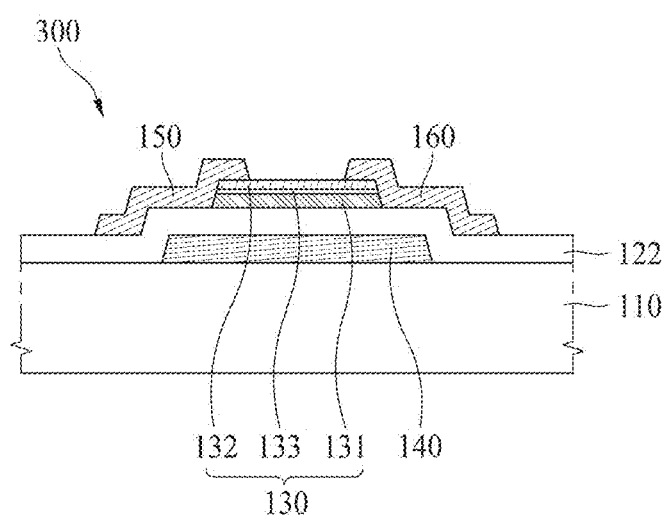
FIG. 3 is a cross-sectional view illustrating a thin-film transistor according to another embodiment of the present disclosure.

FIG. 3 is a cross-sectional view illustrating a thin-film transistor according to another embodiment of the present disclosure.

A thin-film transistor 300 of the FIG. 3 example may include a gate electrode 140 on a substrate 110, and a semiconductor layer 130 spaced apart from the gate electrode 140 and partially overlapping the gate electrode 140. Also, the thin-film transistor 300 may include a gate insulating layer 122 between the gate electrode 140 and the semiconductor layer 130, a source electrode 150 connected to the semiconductor layer 130, and a drain electrode 160 spaced apart from the source electrode 150 and connected to the semiconductor layer 130.

As shown in FIG. 3, the structure in which the gate electrode 140 is disposed below the semiconductor layer 130 may be referred to as a "bottom-gate" structure. Herein, the semiconductor layer 130, the gate electrode 140, the source electrode 150, and the drain electrode 160 may constitute the thin-film transistor 300.

With reference to FIG. 3, a first oxide semiconductor layer 131, a silicon semiconductor layer 133, and a second oxide semiconductor layer 132, which may constitute the semiconductor layer 130, may be sequentially deposited on the substrate 110. However, embodiments of the present disclosure are not limited to the above structure. For example, the first oxide semiconductor layer 131 and the second oxide semiconductor layer 132 may be positioned interchangeably.

Figure 4:
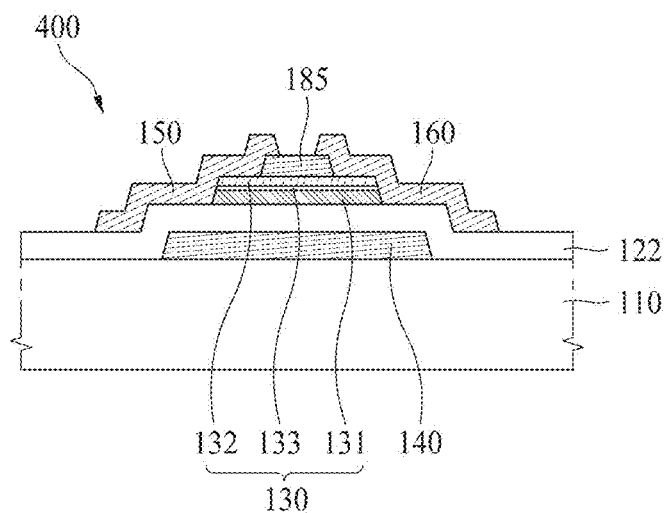
FIG. 4 is a cross-sectional view illustrating a thin-film transistor according to another embodiment of the present disclosure.

FIG. 4 is a cross-sectional view illustrating a thin-film transistor 400 according to another embodiment of the present disclosure.

In comparison with the thin-film transistor 300 shown in the FIG. 3 example, the thin-film transistor 400 shown in the FIG. 4 example may further include an etch stopper 185 on a semiconductor layer 130. The etch stopper 185 may include an insulating material. The etch stopper 185 may protect a channel region of the semiconductor layer 130. Thus, the semiconductor layer 130 according to one embodiment of the present disclosure may be applied to the thin-film transistor 400 having an etch stopper structure.

Figure 5:
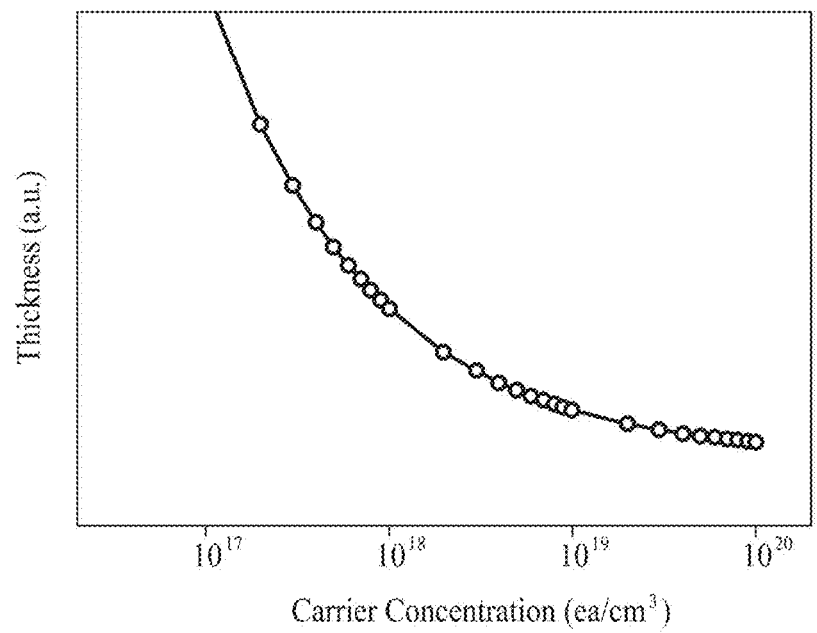
FIG. 5 is a graph illustrating a relation between a thickness of an oxide semiconductor layer and a carrier concentration of an oxide semiconductor layer in a thin-film transistor having uniformity of a threshold voltage.

FIG. 5 is a graph illustrating a relation between a thickness of an oxide semiconductor layer and a carrier concentration of an oxide semiconductor layer in a thin-film transistor having uniformity of a threshold voltage.

To provide an oxide semiconductor layer functioning as a channel layer of a thin-film transistor, the oxide semiconductor layer may have a high carrier concentration. However, on the presumption that the oxide semiconductor layer has the high carrier concentration, if a thickness of the oxide semiconductor layer is increased, a variable range of the threshold voltage in the thin-film transistor may be increased due to a large amount of carriers existing in the oxide semiconductor layer, whereby the switching properties may be lowered. To prevent this problem, the thickness of the oxide semiconductor layer may be small.

In FIG. 5, when a thin-film transistor has an oxide semiconductor layer, a variable range of a threshold voltage may be 1 V or less, which may provide conditions enabling good uniformity of threshold voltage. For example, when the variable range of the threshold voltage in the thin-film transistor is 1 V or less, the thickness of the oxide semiconductor layer for the carrier concentration of the oxide semiconductor layer may be as shown in FIG. 5.

With reference to FIG. 5, as the carrier concentration of the oxide semiconductor layer increases, the thickness of the oxide semiconductor layer may have to be small, whereby the variable range of the threshold voltage in the thin-film transistor may be 1V or less. For example, on the presumption that an IGZO-based oxide semiconductor layer (In:Ga:Zn=1:1:1, atom number) has a carrier concentration of $10^{19}/cm^3$, when a thickness of the IGZO-based oxide semiconductor layer is about 15 nm or less, a variable range of a threshold voltage in a thin-film transistor may be 1 V or less.

Hereinafter, when a semiconductor layer is formed only with a second oxide semiconductor layer 132 functioning as a channel layer, its problem will be described as follows.

Figure 6:
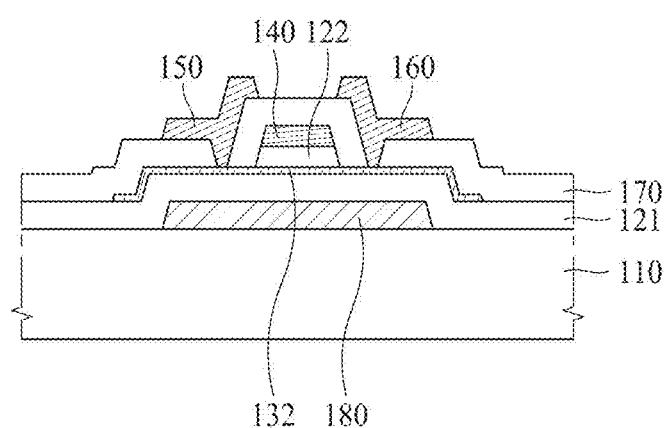
FIG. 6 is a cross-sectional view illustrating a thin-film transistor according to a Comparative Example 1.

FIG. 6 is a cross-sectional view illustrating a thin-film transistor according to a Comparative Example 1.

The thin-film transistor according to the Comparative Example 1 includes a semiconductor layer formed only with a second oxide semiconductor layer 132 functioning as a channel layer. For example, the thin-film transistor of FIG. 6 is similar in structure to the thin-film transistor 200 of FIG. 2. However, the thin-film transistor of FIG. 6 includes the semiconductor layer formed only with the second oxide semiconductor layer 132. The second oxide semiconductor layer 132 has a thickness of about 15 nm to realize the switching properties.

Figure 7:
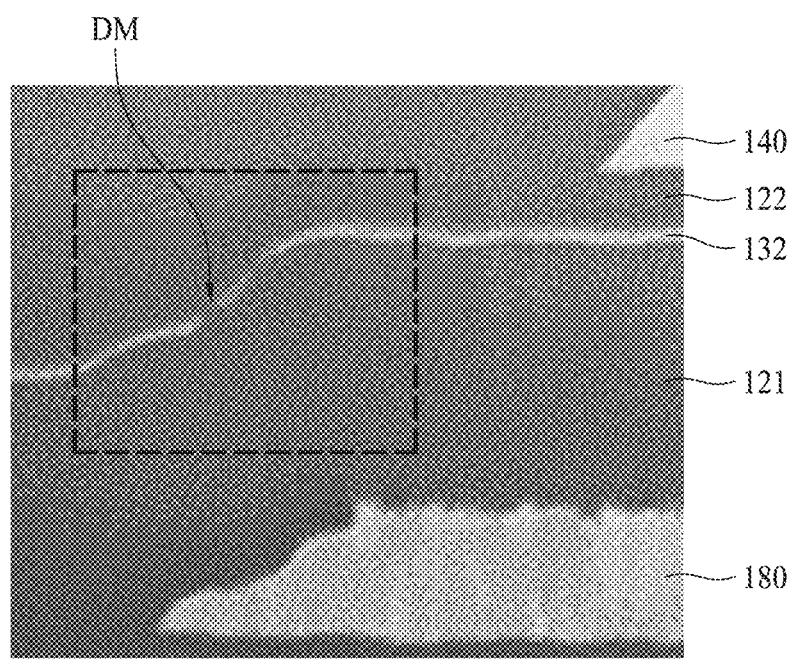
FIG. 7 is a photograph showing a damage (DM) generated in the thin-film transistor of FIG. 6.

FIG. 7 is a photograph showing damage (DM) generated in the thin-film transistor of FIG. 6.

With reference to FIG. 7, the second oxide semiconductor layer 132, which has a thickness of about 15 nm and is singly provided on a buffer layer 121, has an instable film shape having an uneven surface, and damage (DM) of a cutting shape are generated in the second oxide semiconductor layer 132. To overcome this problem, which might be generated in the above structure of the semiconductor layer formed only with the second oxide semiconductor layer 132, a first oxide semiconductor layer 131 functioning as a supporting layer may be disposed below the second oxide semiconductor layer 132 (e.g., Comparative Example 2).

Figure 8:
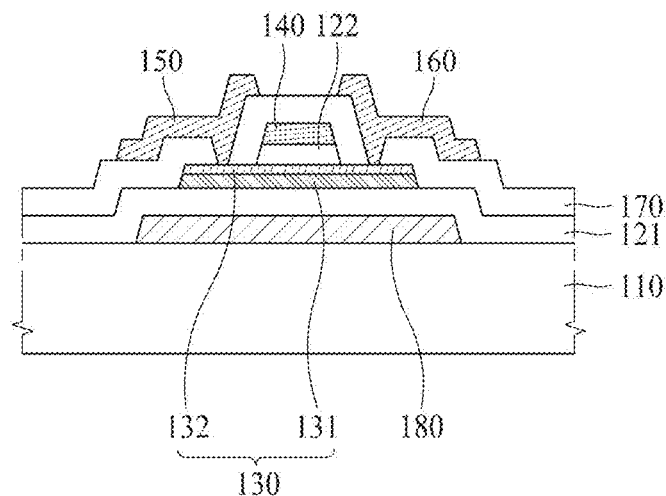
FIG. 8 is a cross-sectional view illustrating a thin-film transistor according to a Comparative Example 2.

FIG. 8 is a cross-sectional view illustrating a thin-film transistor according to a Comparative Example 2.

With reference to FIG. 8, the thin-film transistor according to the Comparative Example 2 includes a semiconductor layer, wherein the semiconductor layer includes a first oxide semiconductor layer 131, and a second oxide semiconductor layer 132 on the first oxide semiconductor layer 131. In FIG. 8, the first oxide semiconductor layer 131 functioning as a supporting layer includes gallium (Ga), whose concentration is relatively higher than that of the second oxide semiconductor layer 132 to realize the film stability. For example, the first oxide semiconductor layer 131 corresponds to an IGZO-based oxide semiconductor layer in which an atom ratio of indium (In), gallium (Ga), and zinc (Zn) is 2:1:1 (In:Ga:Zn=1:1:1, atom number).

Figure 9:
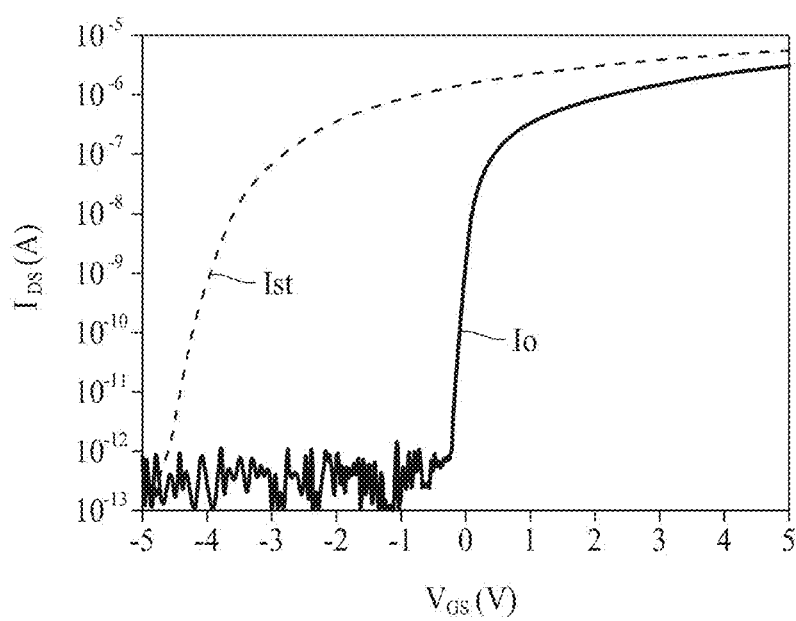
FIG. 9 is a graph illustrating a comparison result of showing a threshold voltage in the thin-film transistor of the Comparative Example 2 onto which light is irradiated, and a threshold voltage in the thin-film transistor of the Comparative Example 2 onto which light is not irradiated.

FIG. 9 is a graph illustrating a comparison result of showing a threshold voltage in the thin-film transistor of the Comparative Example 2 onto which light is irradiated, and a threshold voltage in the thin-film transistor of the Comparative Example 2 onto which light is not irradiated.

The graph of FIG. 9 shows a current (IDS) between a source electrode and a drain electrode in accordance with a voltage (VGS) between a gate electrode and a source electrode. In FIG. 9, "$I_0$" is a line (solid line) illustrating the threshold voltage before light is irradiated, and "$I_{ST}$" is a line (dotted line) illustrating the threshold voltage after light is irradiated.

Generally, gallium (Ga) is excited by light, and then the excited gallium may emit an excited electron. Also, gallium (Ga) traps a hole so that it is possible to prevent an electron from being restricted by the hole. If the first oxide semiconductor layer 131 is irradiated with light, gallium (Ga) included in the first oxide semiconductor layer 131 absorbs light, to thereby emit the excited electron. In the thin-film transistor according to the Comparative Example 2 (see FIG. 8), as the first oxide semiconductor layer 131 is in direct contact with the second oxide semiconductor layer 132, the electron generated from gallium (Ga) by the light absorption is transferred to the second oxide semiconductor layer 132, whereby the carrier concentration of the second oxide semiconductor layer 132 is increased. If the carrier (electron) concentration of the second oxide semiconductor layer 132 is increased, the threshold voltage is lowered, whereby the threshold voltage of the thin-film transistor is shifted to a negative (−) direction. As a result, as shown in FIG. 9, in comparison to "$I_0$" corresponding to the graph showing the threshold voltage before light is irradiated, "$I_{ST}$" corresponding to the graph showing the threshold voltage after light is irradiated is shifted to a negative (−) direction.

To reduce or prevent the driving instability of the thin-film transistor, that is, to reduce or prevent the carrier concentration of the second oxide semiconductor layer 132 from being increased by the first oxide semiconductor layer 131, the thin-film transistor 100 according to one embodiment of the present disclosure may include the silicon semiconductor layer 133 between the first oxide semiconductor layer 131 and the second oxide semiconductor layer 132. The silicon semiconductor layer 133 may function as the light-shielding layer or electron-interrupting layer.

Figure 10:
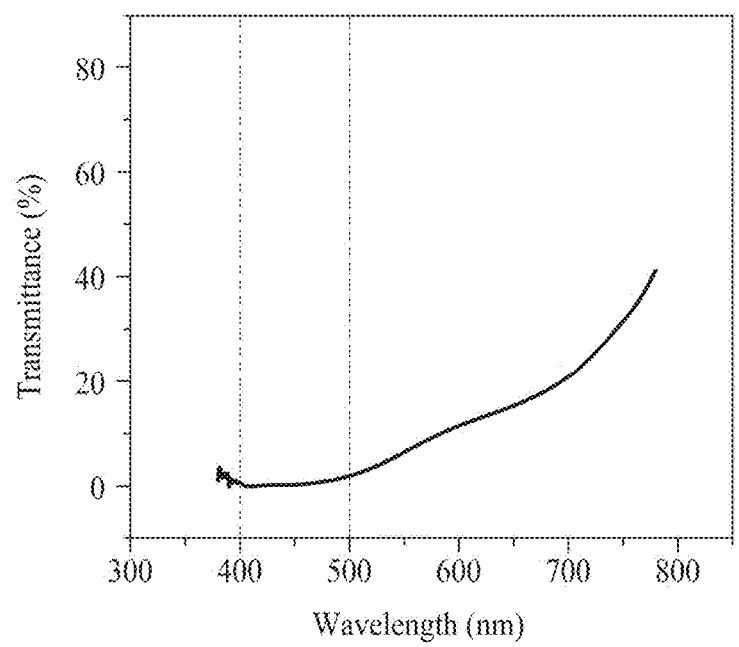
FIG. 10 is a graph illustrating a light transmittance of silicon.

FIG. 10 is a graph illustrating a light transmittance of silicon.

With reference to FIG. 10, silicon shows a light transmittance of 20% or less in a visible ray range. For example, silicon has a light transmittance of 1% or less for light having a wavelength of 400 nm to 50 nm corresponding to a wavelength range enabling the generation of excited electron by the use of gallium (Ga) included in the first oxide semiconductor layer 131.

Thus, silicon having a low light transmittance is capable of blocking light. As a result, if light is incident from an upper side of the drawing in which the second oxide semiconductor layer 132 is positioned, the silicon semiconductor layer 133 may block light so that it may be possible to restrict or prevent the first oxide semiconductor layer 131 from being irradiated with light. Thus, it may be possible to restrict or prevent the excited electron from being generated in the first oxide semiconductor layer 131.

Also, a slight amount of current may flow through the silicon semiconductor layer 133 of intrinsic semiconductor, or a current may scarcely flow through the silicon semiconductor layer 133 of intrinsic semiconductor, whereby the silicon semiconductor layer 133 may block or reduce a current flow. As a result, even though an electron may be generated in the first oxide semiconductor layer 131 by incident light from a lower side of the drawing in which the substrate 110 is positioned, the silicon semiconductor layer 133 may serve as the electron interrupting layer so that it may be possible to restrict or prevent the electron generated in the first oxide semiconductor layer 131 from being transferred to the second oxide semiconductor layer 132. Thus, according to one embodiment of the present disclosure, if the silicon semiconductor layer 133 is disposed between the first oxide semiconductor layer 131 and the second oxide semiconductor layer 132, it may be possible to avoid or prevent the carrier concentration of the second oxide semiconductor layer from being increased, to thereby constantly maintain the electrical properties in the second oxide semiconductor layer 132.

Figure 11:
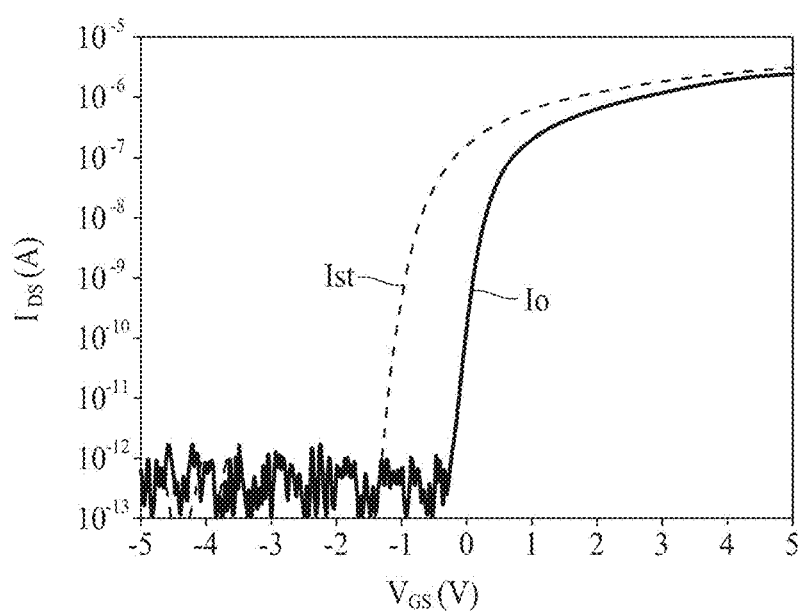
FIG. 11 is a graph illustrating a comparison result of showing a threshold voltage in the thin-film transistor according to one embodiment of the present disclosure onto which light is irradiated, and a threshold voltage in the thin-film transistor according to one embodiment of the present disclosure onto which light is not irradiated.

FIG. 11 is a graph illustrating a comparison result of showing a threshold voltage in the thin-film transistor according to one embodiment of the present disclosure onto which light is irradiated, and a threshold voltage in the thin-film transistor according to one embodiment of the present disclosure onto which light is not irradiated.

The graph of FIG. 11 is expressed as a current ($I_{DS}$) between a source electrode and a drain electrode in accordance with a voltage ($V_{GS}$) between a gate electrode and a source electrode. In FIG. 11, "$I_0$" is a line (solid line) illustrating the threshold voltage before light is irradiated, and "$I_{ST}$" is a line (dotted line) illustrating the threshold voltage after light is irradiated.

With reference to FIG. 11, in comparison to "$I_0$" corresponding to the graph showing the threshold voltage before light is irradiated, "$I_{ST}$" corresponding to the graph showing the threshold voltage after light is irradiated is not very (scarcely) shifted. Thus, according to one embodiment of the present disclosure, it may be possible to secure the driving stability of the thin-film transistor 100.

Figure 12:
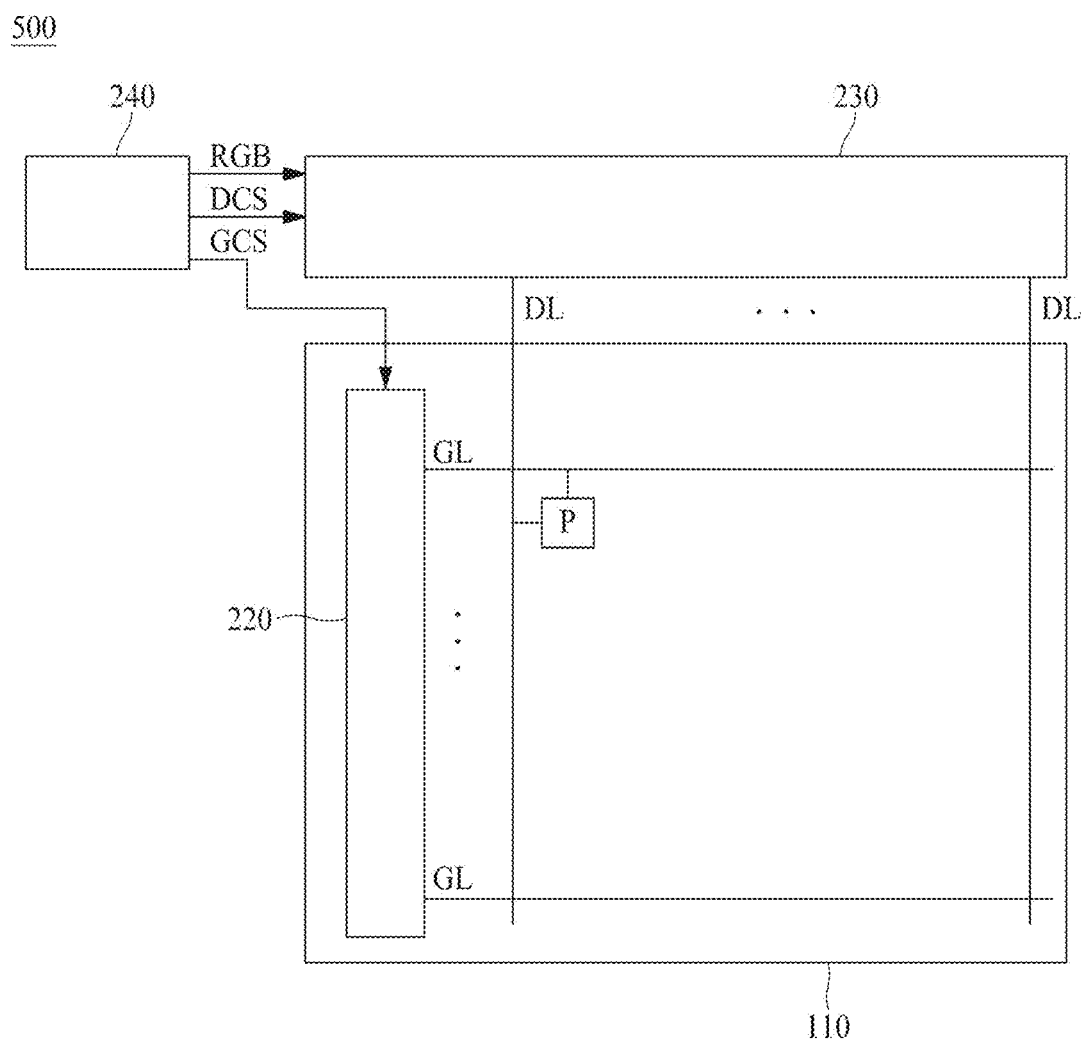
FIG. 12 is a view illustrating a display device according to another embodiment of the present disclosure.
Figure 13:
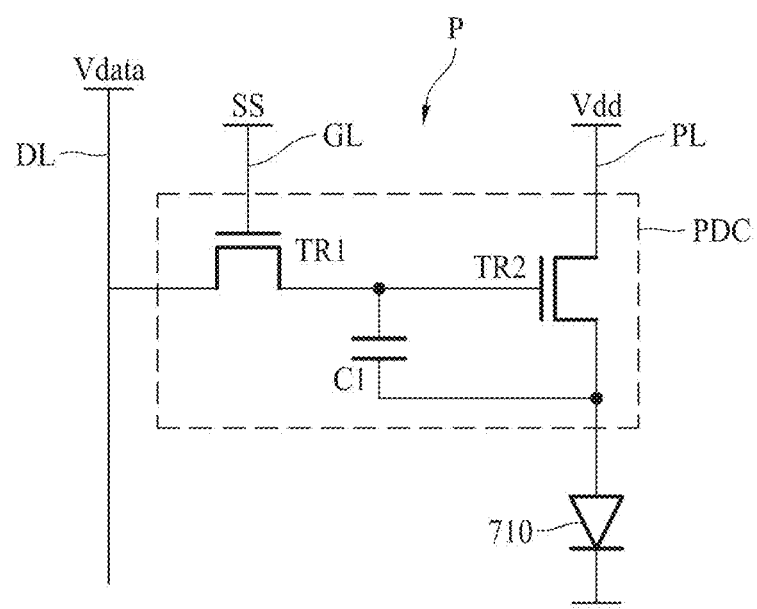
FIG. 13 is a circuit diagram illustrating any one pixel (P) of FIG. 12.
Figure 14:
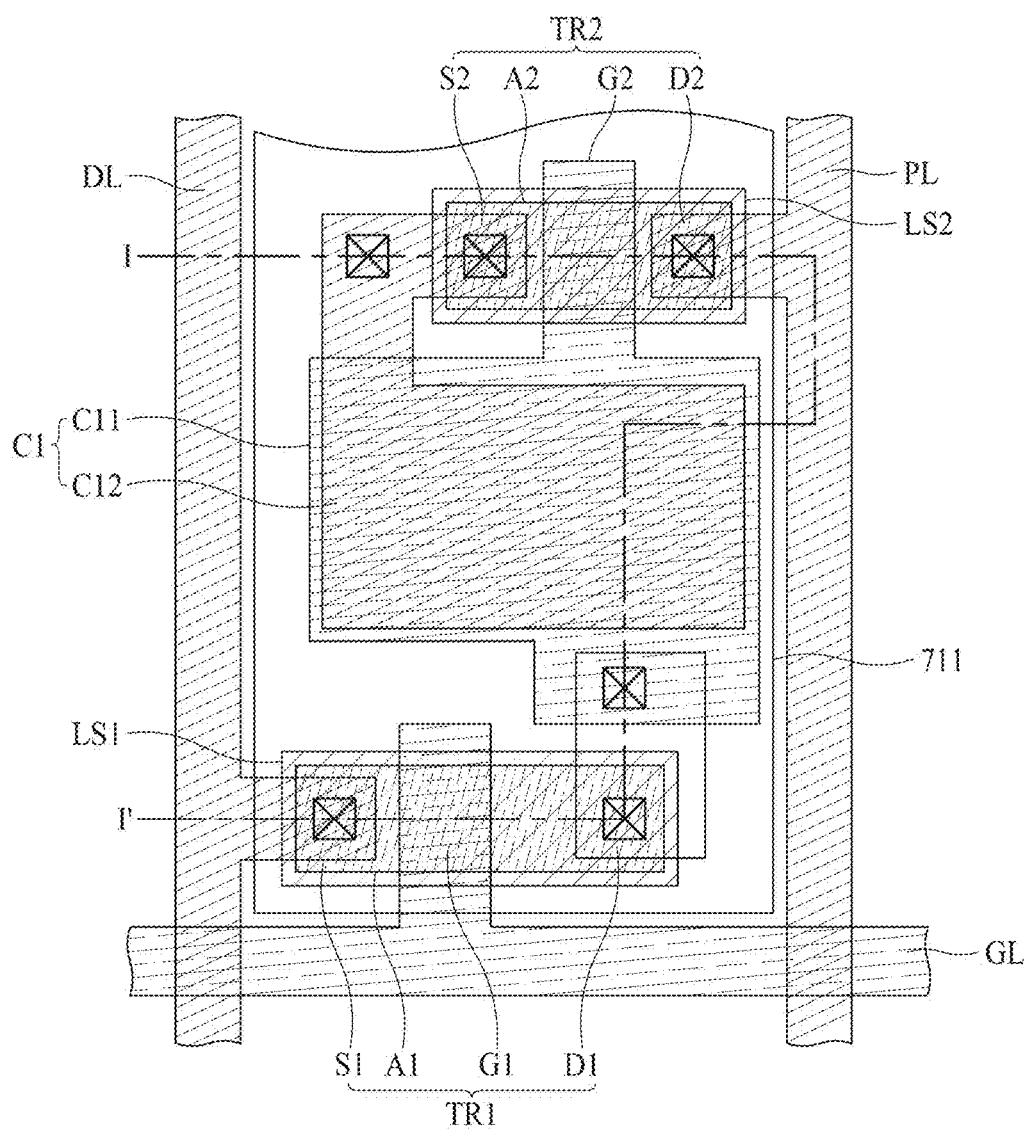
FIG. 14 is a plane view illustrating the pixel (P) of FIG. 13.
Figure 15:
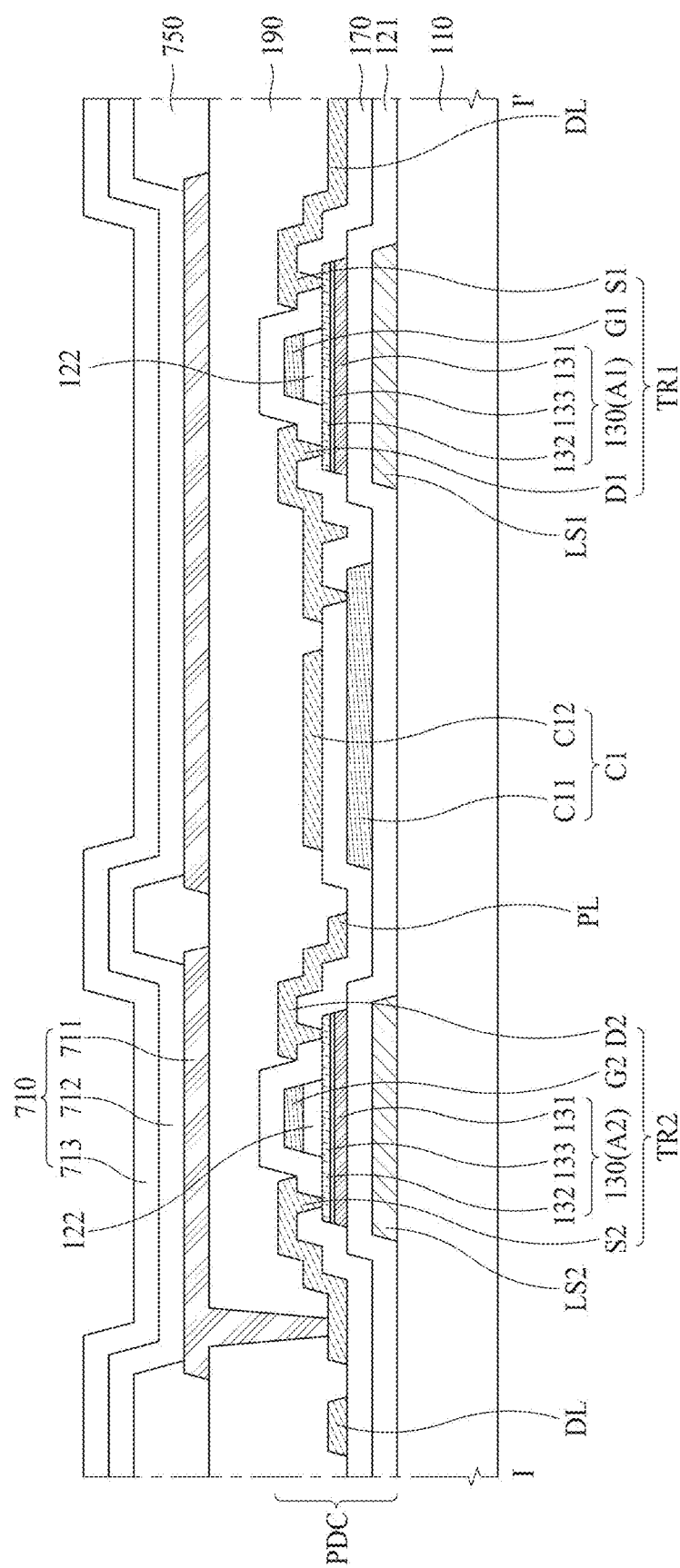
FIG. 15 is a cross-sectional view along line I-I' of FIG. 14.

FIG. 12 is a view illustrating a display device according to another embodiment of the present disclosure. FIG. 13 is a circuit diagram illustrating any one pixel (P) of FIG. 12. FIG. 14 is a plane view illustrating the pixel (P) of FIG. 13. FIG. 15 is a cross-sectional view along line I-I' of FIG. 14.

Hereinafter, a display device 500 according to another embodiment of the present disclosure will be described with reference to FIGS. 12 to 15. The display device 500 according to another embodiment of the present disclosure may include a substrate 110, a pixel driving circuit (PDC) on the substrate 110, and a display element 710 connected to the pixel driving circuit (PDC). The pixel driving circuit (PDC) may include a thin-film transistor. Any of the thin-film transistors 100, 200, 300, and 400 shown in the examples of FIGS. 1, 2, 3, and 4 may be used for the thin-film transistor. Thus, to avoid a repetitive explanation, a detailed description for the thin-film transistors 100, 200, 300, and 400 will be omitted.

As shown in the FIG. 12 example, the display device 500 according to another embodiment of the present disclosure may include a pixel (P), a gate driver 220, a data driver 230, and a controller 240 on a substrate 110. On the substrate 110, there may be gate lines (GL) and data lines (DL), and the pixel (P) may be at a crossing portion of the gate line (GL) and the data line (DL). The pixel (P) may include a display element 710, and a pixel driving circuit (PDC) for driving the display element 710. An image may be displayed by driving the pixel (P).

The controller 240 may control the gate driver 220 and the data driver 230. The controller 240 may output a gate control signal (GCS) for controlling the gate driver 220 and a data control signal (DCS) for controlling the data driver 230 by the use of vertically/horizontally synchronized signal and clock signal supplied from an external system (not shown). Also, the controller 240 may sample input video data, which may be provided from the external system, and then may re-align the sampled video data, and may supply the re-aligned digital video data (RGB) to the data driver 230.

The gate control signal (GCS) may include a gate start pulse (GSP), a gate shift clock (GSC), a gate output enable signal (GOE), a start signal (Vst), and a gate clock (GCLK). Also, control signals for controlling a shift register may be included in the gate control signal (GCS). The data control signal (DCS) may include a source start pulse (SSP), a source shift clock signal (SSC), a source output enable signal (SOE), and a polarity control signal (POL).

The data driver 230 may supply a data voltage to the data lines (DL) on the substrate 110. For example, the data driver 230 may convert the video data (RGB) provided from the controller 240 into an analog data voltage, and may supply the analog data voltage to the data lines (DL).

The gate driver 220 may sequentially supply a gate pulse (GP) to the gate lines (GL) for one (1) frame period. Herein, "one frame" indicates the period in which one image is output through a display panel. Also, the gate driver 220 may supply a gate-off signal for turning off the switching device to the gate line (GL) for the remaining period of one frame in which the gate pulse (GP) is not supplied. Hereinafter, the gate pulse (GP) and the gate-off signal (Goff) are referred to together as "scan signals (SS)."

According to one embodiment of the present disclosure, the gate driver 220 may be on the substrate 110. A structure of directly providing the gate driver 220 on the substrate 110 may be referred to as Gate-In-Panel (GIP) structure.

The circuit diagram of FIG. 13 corresponds to an equivalent circuit diagram for one pixel (P) in a display device 500, including an organic light-emitting diode (OLED). A pixel driving circuit (PDC) of FIG. 13 may include a first thin-film transistor (TR1) corresponding to a switching transistor, and a second thin-film transistor (TR2) corresponding to a driving transistor. Any of the thin-film transistors 100, 200, 300, and 400 shown in FIGS. 1, 2, 3, and 4 may be used for the first thin-film transistor (TR1) and the second thin-film transistor (TR2).

The first thin-film transistor (TR1) may be connected to gate and data lines (GL, DL), and may be turned on or turned off by a scan signal (SS) supplied through the gate line (GL). The data line (DL) may provide a data voltage (Vdata) to the pixel driving circuit (PDC), and the first thin-film transistor (TR1) may control an application of the data voltage (Vdata).

A driving voltage line (PL) may provide a driving voltage (Vdd) to a display element 710, and the second thin-film transistor (TR2) may control the driving voltage (Vdd). The driving voltage (Vdd) may correspond to a pixel driving voltage for driving the organic light-emitting diode (OLED) corresponding to the display element 710.

When the first thin-film transistor (TR1) is turned on by the scan signal (SS) applied from a gate driver 220 via the gate line (GL), the data voltage (Vdata) supplied via the data line (DL) may be supplied to a gate electrode (G2) of the second thin-film transistor (TR2) connected to the emission element 710. The data voltage (Vdata) may be charged in a first capacitor (C1) provided between the gate electrode (G2) of the second thin-film transistor (TR2) and a source electrode (S2) of the second thin-film transistor (TR2). The first capacitor (C1) may correspond to a storage capacitor (Cst). The first capacitor (C1) may include a first capacitor electrode (C11) connected to the gate electrode (G2) of the second thin-film transistor (TR2), and a second capacitor electrode (C12) connected to the source electrode (S2) of the second thin-film transistor (TR2). A supply amount of current supplied to the organic light-emitting diode (OLED) corresponding to the display element 710 through the second thin-film transistor (TR2) may be controlled in accordance with the data voltage (Vdata), whereby it may be possible to control a grayscale of the light emitted from the display element 710.

With reference to FIGS. 14 and 15, the pixel driving circuit (PDC) may be on a substrate 110. The substrate 110 may include glass or plastic. For example, the substrate 110 may include a transparent plastic material having flexibility, for example, polyimide.

The pixel driving circuit (PDC) may include a light-shielding layer (LS1, LS2) on the substrate 110, a buffer layer 121 on the light-shielding layer (LS1, LS2), a semi-conductor layer (A1, A2) 130 on the buffer layer 121, a gate electrode (G1, G2) partially overlapping the semiconductor layer (A1, A2) 130, and a source electrode (S1, S2) and a drain electrode (D1, D2) connected to the semiconductor layer (A1, A2) 130. The light-shielding layer (LS1, LS2) may be formed of an electrical conductive material such as metal. The light-shielding layer (LS1, LS2) may have the light-blocking properties. According to one embodiment of the present disclosure, the light-shielding layer (LS1, LS2) may block externally-provided light, to thereby protect the semiconductor layer 130.

The buffer layer 121 may be on the light-shielding layer (LS1, LS2). The buffer layer 121 may include an insulating material, and may protect the semiconductor layer 130 from externally-provided moisture or oxygen. The semiconductor layer (A1) of the first thin-film transistor (TR1) and the semiconductor layer (A2) of the second thin-film transistor (TR2) may be on the buffer layer 121. At least one of the semiconductor layer (A1) of the first thin-film transistor (TR1) and the semiconductor layer (A2) of the second thin-film transistor (TR2) may include a first oxide semiconductor layer 131 on the buffer layer 121, a silicon semiconductor layer 133 on the first oxide semiconductor layer 131, and a second oxide semiconductor layer 132 on the silicon semiconductor layer 133.

With further reference to FIG. 15, each of the semiconductor layer (A1) of the first thin-film transistor (TR1) and the semiconductor layer (A2) of the second thin-film transistor (TR2) may be formed in a structure including the first oxide semiconductor layer 131, the silicon semiconductor layer 133, and the second oxide semiconductor layer 132 deposited in sequence. However, embodiments of the present disclosure are not limited to the above. For example, any one of the semiconductor layer (A1) of the first thin-film transistor (TR1) and the semiconductor layer (A2) of the second thin-film transistor (TR2) may be formed in a structure including the first oxide semiconductor layer 131, the silicon semiconductor layer 133, and the second oxide semiconductor layer 132 deposited in sequence.

A gate insulating layer 122 may be on the semiconductor layer 130. The gate insulating layer 122 may have the insulating properties. The gate electrode (G1, G2) may be on the gate insulating layer 122. The gate electrode (G1, G2) may be an area extending from the gate line (GL), or may be a part of the gate line (GL). An insulating interlayer 170 may be on the gate electrode (G1, G2).

The source electrode (S1, S2) and the drain electrode (D1, D2) may be on the insulating interlayer 170. According to one embodiment of the present disclosure, the source electrode (S1, S2) and the drain electrode (D1, D2) are distinguished from each other for convenience of explanation; however, the source electrode (S1, S2) and the drain electrode (D1, D2) may be used interchangeably. For example, the source electrode (S1, S2) may be the drain electrode (D1, D2), and the drain electrode (D1, D2) may be the source electrode (S1, S2).

According to one embodiment of the present disclosure, the source electrode (S1) and the drain electrode (D1) included in the first thin-film transistor (TR1) may be spaced apart from each other, and may be connected to the semiconductor layer (A1) of the first thin-film transistor (TR1). The source electrode (S2) and the drain electrode (D2) included in the second thin-film transistor (TR2) may be spaced apart from each other, and may be connected to the semiconductor layer (A2) of the second thin-film transistor (TR2).

Also, the data line (DL) and the driving power line (PL) may be on the insulating interlayer 170. According to one embodiment of the present disclosure, the source electrode (S1) of the first thin-film transistor (TR1) may be connected to the data line (DL). The drain electrode (D2) of the second thin-film transistor (TR2) may be connected to the driving power line (PL).

As shown in the FIG. 15 example, the first thin-film transistor (TR1) may include the semiconductor layer (A1) 130, the gate electrode (G1), the source electrode (S1), and the drain electrode (D1). The first thin-film transistor (TR1) may function as the switching transistor for controlling the data voltage (Vdata) applied to the pixel driving circuit (PDC).

The second thin-film transistor (TR2) may include the semiconductor layer (A2) 130, the gate electrode (G2), the source electrode (S2), and the drain electrode (D2). The second thin-film transistor (TR2) may function as the driving transistor for controlling the driving voltage (Vdd) applied to the display element 710.

A planarization layer 190 may be on the source electrode (S1, S2), the drain electrode (D1, D2), the data line (DL), and the driving power line (PL). The planarization layer 190 may planarize an upper surface of the first thin-film transistor (TR1) and an upper surface of the second thin-film transistor (TR2), and may also protect the first thin-film transistor (TR1) and the second thin-film transistor (TR2).

A first electrode 711 of the display element 710 may be on the planarization layer 190. The first electrode 711 of the display element 710 may be connected to the source electrode (S2) of the second thin-film transistor (TR2) via a contact hole provided in the planarization layer 190.

A bank layer 750 may be in the edge of the first electrode 711. The bank layer 750 may define an emission area of the display element 710.

An organic emission layer 712 may be on the first electrode 711, and a second electrode 713 may be on the organic emission layer 712, whereby the display element 710 may be completed. The display element 710 shown in the example of FIG. 15 may correspond to the organic light-emitting diode (OLED). Accordingly, the display device according to one embodiment of the present disclosure may correspond to the organic light-emitting display device.

Figure 16:
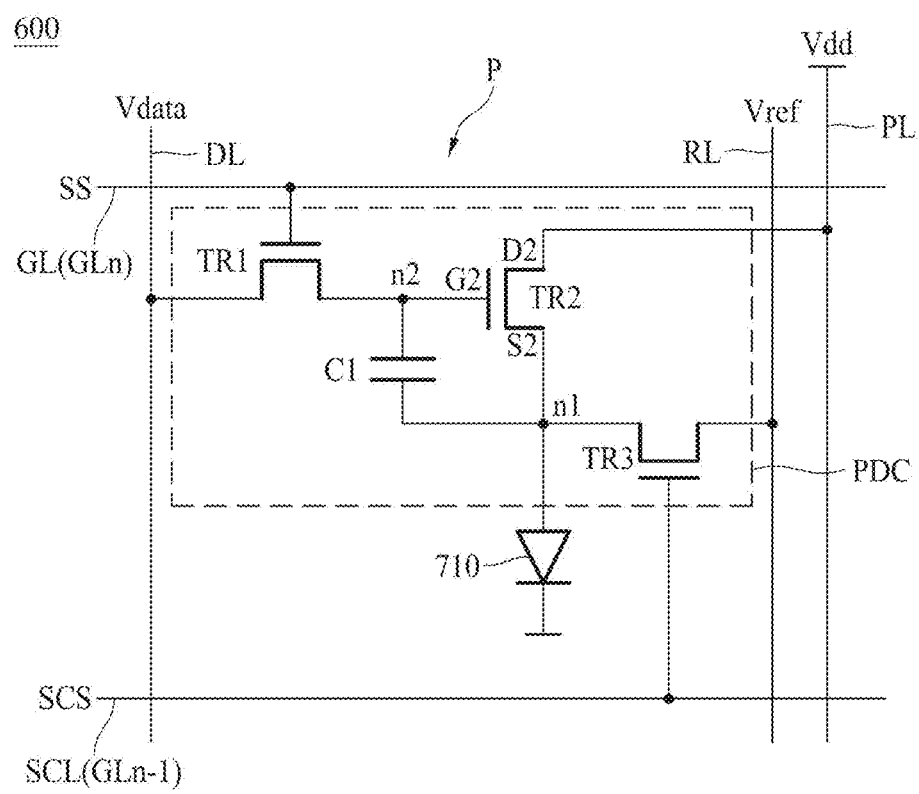
FIG. 16 is a circuit diagram illustrating any one pixel (P) of a display device according to another embodiment of the present disclosure.

FIG. 16 is a circuit diagram illustrating any one pixel (P) of a display device according to another embodiment of the present disclosure.

FIG. 16 is an equivalent circuit diagram for a pixel (P) of an organic light-emitting display device. The pixel (P) of a display device 600 shown in the FIG. 16 example may include an organic light-emitting diode (OLED) corresponding to a display element 710, and a pixel driving circuit (PDC) for driving the display element 710. The display element 710 may be connected to the pixel driving circuit (PDC). In the pixel (P), there may be signal lines (DL, GL, PL, RL, SCL) for supplying a signal to the pixel driving circuit (PDC). A data voltage (Vdata) may be supplied to a data line (DL), a scan signal (SS) may be supplied to a gate line (GL), a driving voltage (VDD) for driving the pixel may be supplied to a driving voltage line (PL), a reference voltage (Vref) may be supplied to a reference line (RL), and a sensing control signal (SCS) may be supplied to a sensing control line (SCL).

With reference to FIG. 16, when the gate line of the $n^{th}$ pixel (P) is referred to as "GLn", the gate line of the neighboring $(n-1)^{th}$ pixel (P) may be "GLn-1", and the gate line of the $(n-1)^{th}$ pixel (P) may serve as the sensing control line (SCL) of the $n^{th}$ pixel (P). For example, the pixel driving circuit (PDC) may include a first thin-film transistor (TR1, e.g., a switching transistor) connected to the gate line (GL) and the data line (DL), a second thin-film transistor (TR2, e.g., a driving transistor) configured to control a level of current provided to the display element 710 in accordance with the data voltage (Vdata) transmitted through the first thin-film transistor (TR1), and a third thin-film transistor (TR3, e.g., a reference transistor) configured to sense the properties of the second thin-film transistor (TR2).

A first capacitor (C1) may be positioned between the display element 710 and a gate electrode (G2) of the second thin-film transistor (TR2). The first capacitor (C1) may be referred to as a "storage capacitor (Cst)."

The first thin-film transistor (TR1) may be turned on by the scan signal (SS) supplied to the gate line (GL), and the first thin-film transistor (TR1) may transmit the data voltage (Vdata), which may be supplied to the data line (DL), to the gate electrode (G2) of the second thin-film transistor (TR2). The third thin-film transistor (TR3) may be connected to the reference line (RL) and a first node (n1) between the display element 710 and the second thin-film transistor (TR2). The third thin-film transistor (TR3) may be turned on or turned off by the sensing control signal (SCS), and the third thin-film transistor (TR3) may sense the properties of the second thin-film transistor (TR2) corresponding the driving transistor for a sensing period.

A second node (n2) connected to the gate electrode (G2) of the second thin-film transistor (TR2) may be connected to the first thin-film transistor (TR1). The first capacitor (C1) may be formed between the second node (n2) and the first node (n1).

When the first thin-film transistor (TR1) is turned on, the data voltage (Vdata) supplied through the data line (DL) may be supplied to the gate electrode (G2) of the second thin-film transistor (TR2). The first capacitor (C1) formed between a source electrode (S2) and the gate electrode (G2) of the second thin-film transistor (TR2) may be charged with the data voltage (Vdata). When the second thin-film transistor (TR2) is turned on, a current may be supplied to the display element 710 through the second thin-film transistor (TR2) by the driving voltage (Vdd) for driving the pixel, whereby light may be emitted from the display element 710.

The first thin-film transistor (TR1), the second thin-film transistor (TR2), and the third thin-film transistor (TR3) shown in FIG. 16 may be substantially similar in structure to any one among the thin-film transistors 100, 200, 300, and 400 shown in FIGS. 1, 2, 3, and 4. Duplicate description will be omitted.

Figure 17:
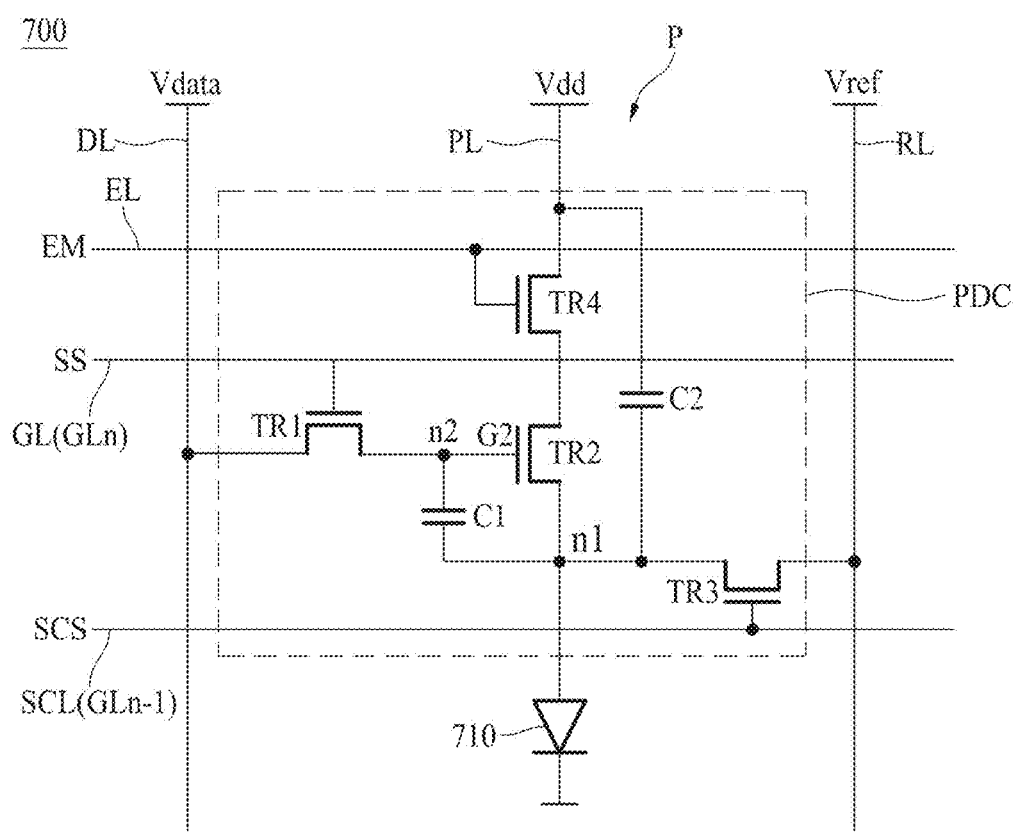
FIG. 17 is a circuit diagram illustrating a pixel of a display device according to another embodiment of the present disclosure.

FIG. 17 is a circuit diagram illustrating a pixel of a display device according to another embodiment of the present disclosure.

The pixel (P) of a display device 700 shown in the FIG. 17 example may include an organic light-emitting diode (OLED) corresponding to a display element 710, and a pixel driving circuit (PDC) for driving the display element 710. The display element 710 may be connected to the pixel driving circuit (PDC). The pixel driving circuit (PDC) may be include thin-film transistors (TR1, TR2, TR3, TR4).

In the pixel (P), there may be signal lines (DL, EL, GL, PL, SCL, RL) for supplying a driving signal to the pixel driving circuit (PDC). In comparison with the pixel (P) of the FIG. 16 example, the pixel (P) of the FIG. 17 example further includes an emission control line (EL). An emission control signal (EM) may be supplied to the emission control line (EL). Also, in comparison with the pixel driving circuit (PDC) of FIG. 16, the pixel driving circuit (PDC) of FIG. 17 further includes a fourth thin-film transistor (TR4) corresponding to an emission control transistor configured to control an emission time point of the second thin-film transistor (TR2). With reference to FIG. 17, when the gate line of the n$^{th}$ pixel (P) is referred to as "GLn", the gate line of the neighboring (n−1)$^{th}$ pixel (P) may be "GLn−1", and the gate line of the (n−1)$^{th}$ pixel (P) may serve as the sensing control line (SCL) of the n$^{th}$ pixel (P).

A first capacitor (C1) may be positioned between the display element 710 and a gate electrode (G2) of the second thin-film transistor (TR2). Also, a second capacitor (C2) may be between one electrode of the display element 710 and a terminal supplied with a driving voltage (Vdd) among a plurality of terminals included in the fourth thin-film transistor (TR4).

The first thin-film transistor (TR1) may be turned on by the scan signal (SS) supplied to the gate line (GL), and the first thin-film transistor (TR1) may transmit the data voltage (Vdata), which may be supplied to the data line (DL), to the gate electrode (G2) of the second thin-film transistor (TR2). The third thin-film transistor (TR3) may be connected to the reference line (RL), and may be turned on or turned off by the sensing control signal (SCS). The third thin-film transistor (TR3) may sense the properties of the second thin-film transistor (TR2) corresponding the driving transistor for a sensing period.

The fourth thin-film transistor (TR4) may transmit the driving voltage (Vdd) to the second thin-film transistor (TR2), or may block the driving voltage (Vdd) in accordance with the emission control signal (EM). When the fourth thin-film transistor (TR4) is turned on, a current may be supplied to the second thin-film transistor (TR2), whereby light may be emitted from the display element 710.

The first thin-film transistor (TR1), the second thin-film transistor (TR2), the third thin-film transistor (TR3) and the fourth thin-film transistor (TR4) shown in FIG. 17 may be substantially similar in structure to any one among the thin-film transistors 100, 200, 300, and 400 shown in FIGS. 1, 2, 3, and 4.

The pixel driving circuit (PDC) according to another embodiment of the present disclosure may be formed in various structures in addition to the above-described structure. For example, the pixel driving circuit (PDC) may include five or more thin-film transistors.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A thin-film transistor, comprising:
   a semiconductor layer comprising:
     a first oxide semiconductor layer comprising gallium (Ga);
     a second oxide semiconductor layer; and
     a silicon semiconductor layer between the first oxide semiconductor layer and the second oxide semiconductor layer; and
   a gate electrode spaced apart from the semiconductor layer and partially overlapping at least a part of the semiconductor layer,
   wherein a concentration of gallium (Ga) in the first oxide semiconductor layer is higher than a concentration of gallium (Ga) in the second oxide semiconductor layer.

2. The thin-film transistor of claim 1, wherein the second oxide semiconductor layer comprises indium (In).

3. The thin-film transistor of claim 1, wherein the first oxide semiconductor layer is thicker than the second oxide semiconductor layer.

4. The thin-film transistor of claim 3, wherein the second oxide semiconductor layer has a thickness of 5 nm to 50 nm.

5. The thin-film transistor of claim 1, wherein the silicon semiconductor layer is thinner than the second oxide semiconductor layer.

6. The thin-film transistor of claim 5, wherein the silicon semiconductor layer has a thickness of 2 T1 to 20 nm.

7. The thin-film transistor of claim 1, wherein the silicon semiconductor layer comprises an intrinsic silicon semiconductor layer.

8. The thin-film transistor of claim 1, wherein the silicon semiconductor layer comprises amorphous silicon.

9. The thin-film transistor of claim 1, wherein the silicon semiconductor layer is formed by metal-organic chemical vapor deposition (MOCVD).

10. The thin-film transistor of claim 1, wherein the silicon semiconductor layer directly contacts at least one of: the first oxide semiconductor layer and the second oxide semiconductor layer.

11. A display device, comprising:
    a substrate;
    a pixel driving circuit on the substrate; and
    a display element connected to the pixel driving circuit,
      the pixel driving circuit comprising a thin-film transistor, the thin-film transistor comprising:
      a semiconductor layer comprising:
        a first oxide semiconductor layer comprising gallium (Ga);
        a second oxide semiconductor layer; and
        a silicon semiconductor layer between the first oxide semiconductor layer and the second oxide semiconductor layer; and
      a gate electrode spaced apart from the semiconductor layer and partially overlapping at least a part of the semiconductor layer,
    wherein a concentration of gallium (Ga) in the first oxide semiconductor layer is higher than a concentration of gallium (Ga) in the second oxide semiconductor layer.

12. The display device of claim 11, wherein the second oxide semiconductor layer comprises indium (In).

13. The display device of claim 11, wherein the first oxide semiconductor layer is thicker than the second oxide semiconductor layer.

14. The display device of claim 13, wherein the second oxide semiconductor layer has a thickness of 5 nm to 50 am.

15. The display device of claim 11, wherein the silicon semiconductor layer is thinner than the second oxide semiconductor layer.

16. The display device of claim 15, wherein the silicon semiconductor layer has a thickness of 2 nm to 20 nm.

17. The display device of claim 11, wherein the silicon semiconductor layer comprises an intrinsic silicon semiconductor layer.

18. The display device of claim 11, wherein the silicon semiconductor layer comprises amorphous silicon.

19. The display device of claim 11, wherein the silicon semiconductor layer is formed by metal-organic chemical vapor deposition (MOCVD).

20. The display device of claim 11, further comprising a light-shielding layer between the substrate and the semiconductor layer.

21. A method of manufacturing a thin-film transistor, the method comprising:
- providing a semiconductor layer comprising:
  - providing a first oxide semiconductor layer comprising gallium (Ga);
  - providing a second oxide semiconductor layer; and
  - forming a silicon semiconductor layer by metal-organic chemical vapor deposition (MOCVD) between the first oxide semiconductor layer and the second oxide semiconductor layer; and
- providing a gate electrode spaced apart from the semiconductor layer and partially overlapping at least a part of the semiconductor layer,
- wherein a concentration of gallium (Ga) in the first oxide semiconductor layer is higher than a concentration of gallium (Ga) in the second oxide semiconductor layer.

* * * * *